United States Patent [19]

Aksu

[11] 3,970,934

[45] July 20, 1976

[54] PRINTED CIRCUIT BOARD TESTING MEANS

[76] Inventor: Akin Aksu, 739 E. 223rd St., Carson, Calif. 90745

[22] Filed: Aug. 12, 1974

[21] Appl. No.: 496,385

[52] U.S. Cl. .......................... 324/158 F; 324/158 P
[51] Int. Cl.² ..................... G01R 1/06; G01R 31/02
[58] Field of Search ............ 324/158 F, 158 P, 72.5, 324/73 R, 73 PC; 339/17 M

[56] References Cited
UNITED STATES PATENTS

| | | | |
|---|---|---|---|
| 2,887,622 | 5/1959 | Rayburn et al. | 324/73 PC |
| 3,016,489 | 1/1962 | Briggs et al. | 324/158 F |
| 3,654,585 | 4/1972 | Wickersham | 324/158 F |

OTHER PUBLICATIONS

Brain, M. L., "Pneumatic Contactor"; IBM Tech. Dis. Bull., Apr. 1971, p. 3567.

*Primary Examiner*—R. V. Rolinec
*Assistant Examiner*—Ernest F. Karlsen
*Attorney, Agent, or Firm*—Fulwider, Patton, Rieber, Lee & Utecht

[57] ABSTRACT

There is disclosed a printed circuit board test fixture which comprises a housing, a pair of parallel, opposed platens with press means associated with at least one of the platens. One of the platens supports a printed circuit board and the other supports a plurality of spring-biased, probe contact units positioned at predetermined locations to make contact to selected points of the printed circuit board when the platens are pressed into registration. When the contact units are carried in a removeable probe head which is one of a plurality of interchangeable probe heads, the test fixture can support an interface connector in substantially parallel alignment to the platens and the probe head bears interface contact members which are moved into mating connection with opposite interface contact members carried by the interface connector.

25 Claims, 14 Drawing Figures

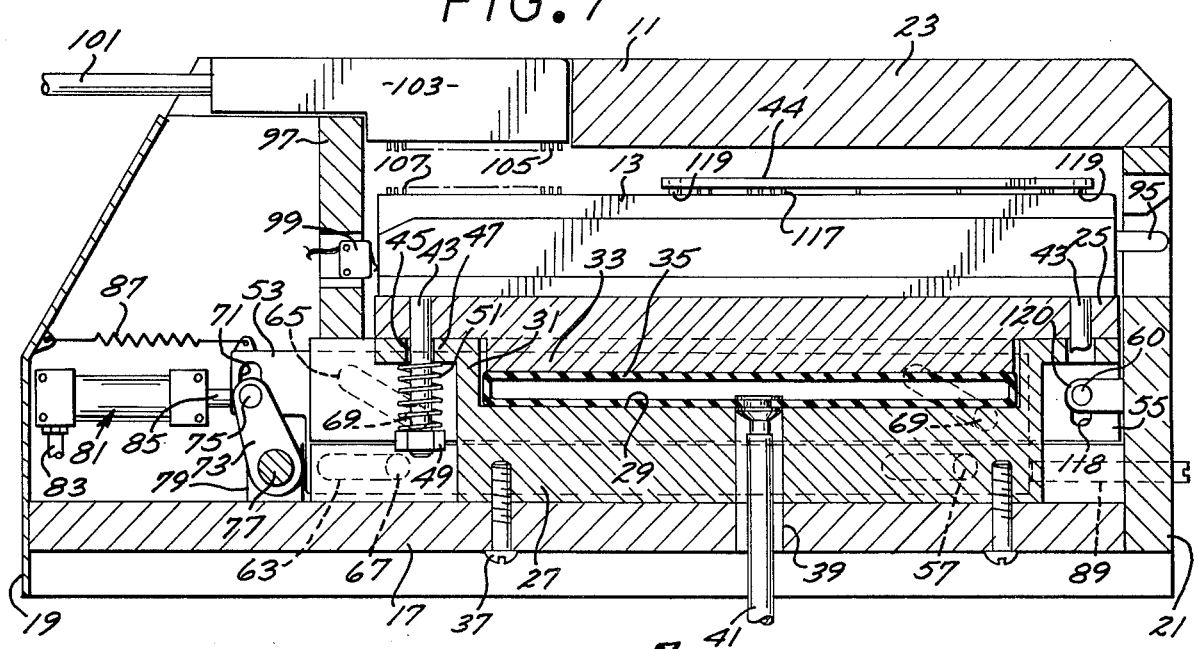
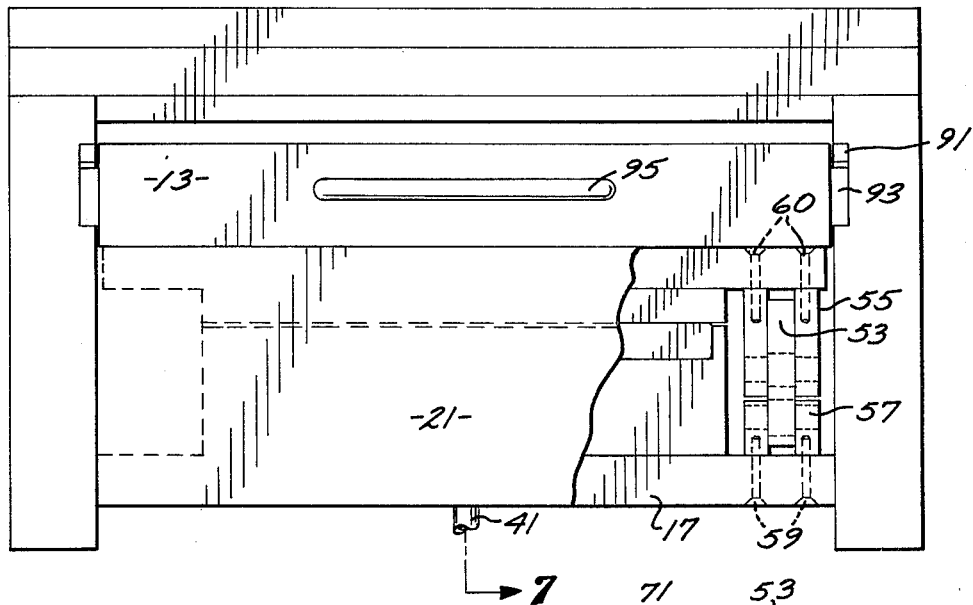
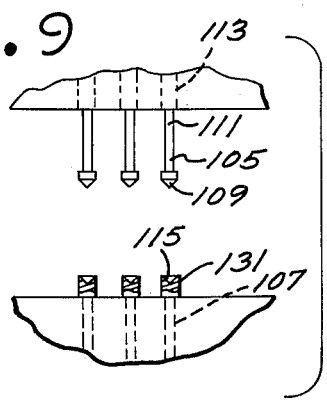
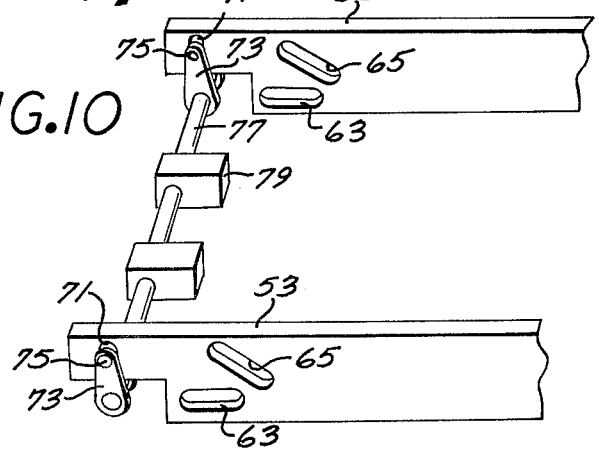

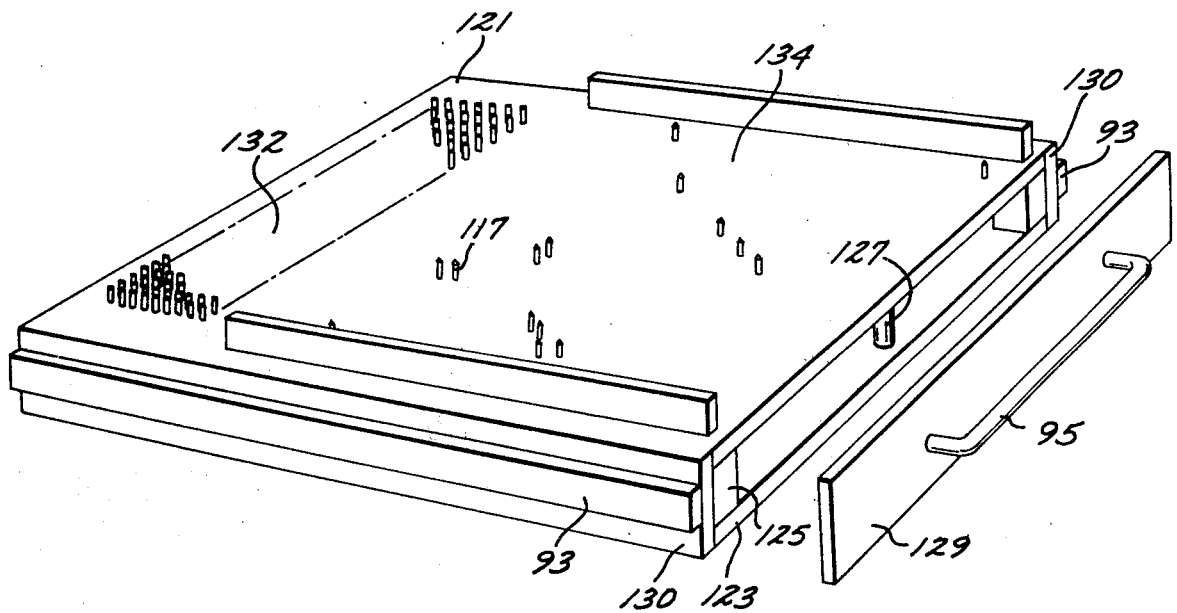
FIG. 11
FIG. 12
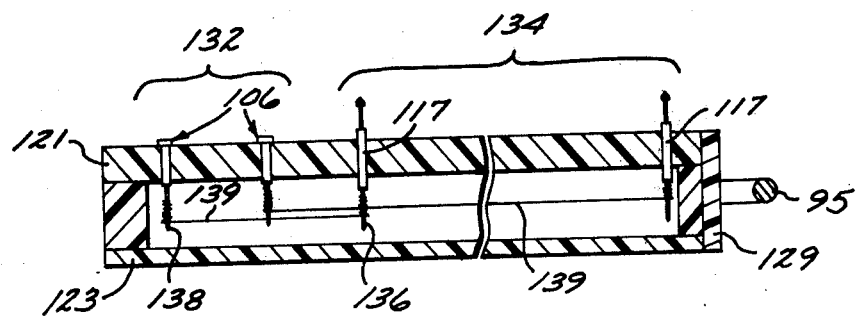

PRINTED CIRCUIT BOARD TESTING MEANS

DESCRIPTION OF THE PRIOR ART:

Fairly complex and cumbersome testing equipment has been developed for the inspection of printed circuit boards. Typically, the testing equipment comprises a large housing which is provided with two horizontal platens, one of which is carried by a press that can effect movement of the platen towards the opposite, stationary platen. Printed circuit boards to be tested are placed in the test fixture, between the platens with a probe head which is typically of box construction and which bears a plurality of spring-biased probe contact units that are spaced at predetermined locations on the upper surface thereof so as to make contact with predetermined points of the printed circuit board when the platens are moved into registration. A typical probe head contains hundreds to many thousands of the spring-biased probe contact units. Since each of the probe contact units requires a force of approximately 1/4 ounce for deflection, the total force applied to the platens is quite large, often exceeding several tons.

The test fixtures have also included an interface connector which has a plurality of interface contact members that are positioned for engagement by mating interface contact members carried by the probe head. Each of the probe contact units carried by the probe head is wired to a corresponding interface contact member so that when the probe head is properly inserted in the test fixture and closed into bearing contact against the printed circuit board, a circuit can be established from connectors outside of the test fixture to any of the preselected points of the printed circuit board. Typically, the interface contact members are mounted in the inboard side wall of the probe head, thus requiring initial engagement of the probe head with the mating interface contact members by cumbersome means such as hand operated screws and the like. The test fixture is interconnected to electrical inspection systems which automatically conduct a programmed review of the conductors, soldered joints and/or components of the printed circuit board.

The equipment typically used for inspection of printed circuit boards has a probe head of box-like construction carrying the probe contact units on its upper surface with the interface contact members on a side surface. This probe head is placed in the test fixture by guiding the head into the fixture until the interface contact members are moved into mating engagement with their opposite members and locked thereto by manually operated screws and the like, then placing the printed circuit board in proper alignment with the probe contact units and moving the platen members into the closed position. The platens are moved with press means that have been actuated by vertically located air cylinders, jack screw means and the like with long guide pins and bushings to maintain the platens parallel during the compressive engagement between the probe head and the circuit board.

The location of the interface contact members to one side of the probe head results in test equipment which has an excessive height and which requires considerable internal bracing to effect even transfer of the compressive forces. Additionally, a considerable amount of labor and time is involved in wiring of the probe head, i.e., in making the necessary wired connections between each of the probe contact units and a corresponding interface contact member. High speed wire connecting means such as wire wrapping techniques cannot be readily employed because of the construction which locates the probe contact units and interface contact members on perpendicular planes.

SUMMARY OF THE INVENTION

This invention comprises improvements in printed circuit board test equipment which effects a considerable reduction in size and bulk of the test fixtures and probe heads and which provides for quick and facile insertion and retraction of a probe head into and out of the test fixture, thereby providing a testing system which can be readily automated. The testing fixture is provided with interface connector means supported in the fixture with the interface contact members associated therewith disposed on a substantially parallel plane to the platens of the fixture. The test fixture also bears compact and simplified means for effecting movement of one or both of the platens of the fixture while maintaining the platens in parallel alignment. In one embodiment of the invention, a test fixture is provided for effecting connection to preselected points on both sides of a printed circuit board.

The improved probe head for use with the aforedescribed test fixture comprises an assembly of two or more generally flat plates which are maintained in substantially parallel alignment by a plurality of spacing members carried therebetween. The probe plate means of the probe head has two, generally parallel, planar contact-bearing-areas. A plurality of spaced apart, spring-biased, probe contact units are carried by the probe plate means with their connector ends extending inboard. These are oriented about one of the two planar contact-bearing-areas to make contact to preselected areas of a printed circuit board when the latter is superimposed and aligned thereon. The probe plate means also bears a plurality of interface contact members which are mounted about the other of the two planar, contact-bearing-areas in positions to make contact with opposite interface contact members that are carried by the interface connector of the test fixture. Because the probe contact units and interface contact members can be disposed in substantially parallel planes, the conventional wire wrapping or termi-point techniques for effecting high speed, wired interconnection between these members can be readily practiced. The pressure force applied to the probe head by the press of the fixture is also more evenly divided across the probe head because of the parallel arrangement of these contact-bearing-areas. The press means associated with each moveable platen of the testing fixture includes side rail means disposed to either side of the moveable platen and a reciprocally mounted slide rail having slot and pin means interconnected with a fixed support and the moveable platen whereby the moveable platen is guided and maintained parallel to the opposite platen during movement thereof. The slide rails are interconnected by crank means to effect a driven interconnection to each other and to one or more actuators therefor such as air cylinders and the like. The press means also, preferably, includes actuator means disposed beneath the moveable platen which comprises an inflatable bag, flexible bag, flexible hose, sealed cavity and the like, whereby fluid pressure can be applied to the outboard surface of the platen to effect compression of the probe head against the printed circuit board.

BRIEF DESCRIPTION OF THE DRAWINGS

The invention will be described by reference to the presently preferred and illustrated embodiments thereof of which:

FIG. 7 is a sectional elevation view of a test fixture and probe head assembly of the invention;

FIG. 8 is a front view of the test equipment of FIG. 1;

FIG. 9 illustrates the members of the interface contact members;

FIG. 10 illustrates the moveable slide rods of the press mechanism;

FIG. 11 is a perspective view of a probe head according to the invention;

FIG. 12 is a sectional elevation view of the probe head of FIG. 11;

FIG. 12 is a side elevation, sectional view of a test fixture and probe heads of the invention for testing opposite sides of a printed circuit board.

DESCRIPTION OF THE PREFERRED EMBODIMENTS

Figure 1:
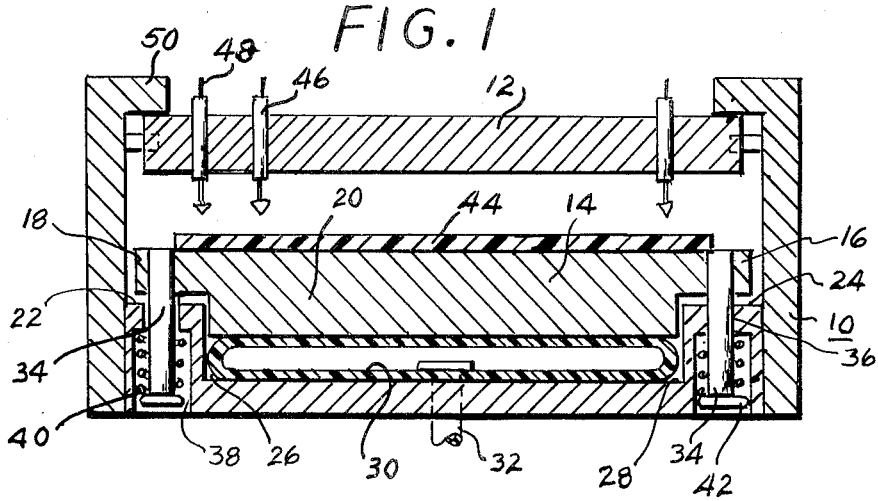
FIG. 1 is a sectional front elevation view of a test fixture of the invention.

The test fixture illustrated in FIG. 1 comprises a housing 10 which supports an upper fixed platen member 12 and lower, moveable platen member 14. The latter has peripheral flange means 16 and 18 and a central boss 20. The housing 10 has stepped opposite sidewalls to provide shoulders 22 and 24 which serve as bottom stops or supports for the peripheral flanges 16 and 18.

Boss 20 extends into cavity 26 and is supported by flanges 16 and 18 above the facing inside wall 28 of housing 10 a slight distance to form an internal chamber therein. Inflatable means in the form of a bag 30 of flexible, preferably elastomeric, sheet material is carried in the chamber with pressured fluid supply means such as conduit 32 which extends through an aperture in the housing into communication with the interior of bag 30.

One or more guidemeans in the form of pins 34 can be carried at edge positions of moveable platen member 14. These pins are slidably mounted in bores 36 through the interior shoulders 22 and 24 of the housing. The bores 36 can be counterbored at 38 to provide an annular space for mounting of compression springs 40 about pins 34. Spring retainers 42 can be placed at the bottom of pins 34 for engagement against springs 40, biasing platen 14 in its retracted position.

The platen members support the circuit board and spring-biased probe contact units. As shown in FIG. 1, the lower platen member 14 supports the circuit board 44 on its upper flat surface while the upper platen 12 bears a plurality of the probe contact units 46 at preselected locations thereon to make contact with preselected points on solder points and conductors of the circuit board 44. The opposite ends of contact units 46 are attached to conductors 48 which lead externally of the housing 10 to suitable test equipment. Although upper platen 12 is shown as fixedly carried on the undersurface of lips 50 which project inwardly from the walls of housing 10, other means could also be provided, e.g., member 12 could include a removeable probe head which is one of a series of interchangeable probe heads in the manner hereafter described in greater detail.

Figure 2:
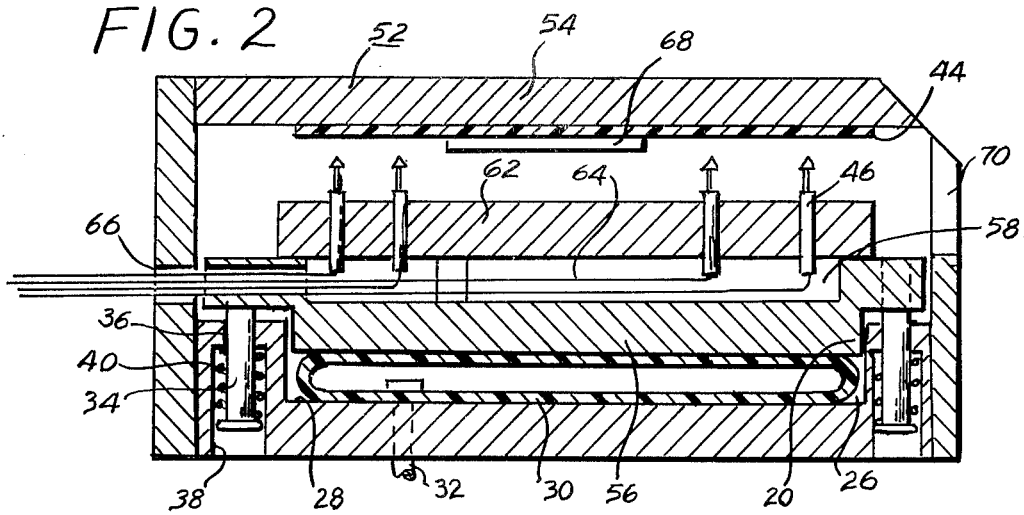
FIG. 2 is a sectional side elevation view of another test fixture of the invention.

FIG. 2 illustrates another constructional variation of the invention. In this embodiments, housing 52 is shown with an upper platen member 54 which is the top wall of the housing and a moveable, lower platen member 56. The lower platen has press and guide means which are similar to the commonly numbered elements of FIG. 1. The upper surface of lower platen member 56 is recessed at 58 to receive the inboard ends of probe contact units 46 which are carried by probe head 62. The inboard ends of these units 46 are each attached to a connector lead 64 which extends through aperture 66 externally of housing 52.

The upper platen member supports circuit board 44 which is removeably secured thereto by suitable means such as support shelf 68. Access to the interior of housing 52 for insertion and removal of circuit board 44 is through the window 70 in the front wall of housing 52.

Figure 3:
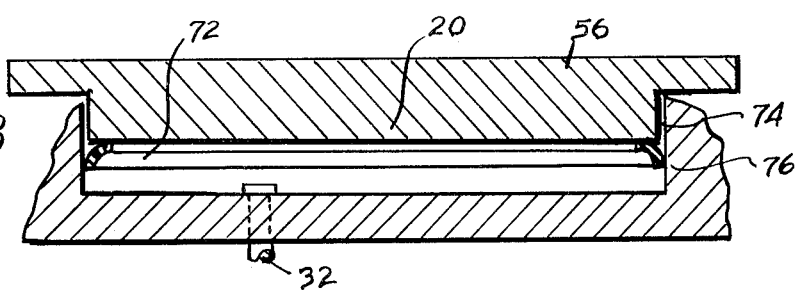
FIGS. 3 and 4 illustrate alternative inflatable means.
Figure 4:
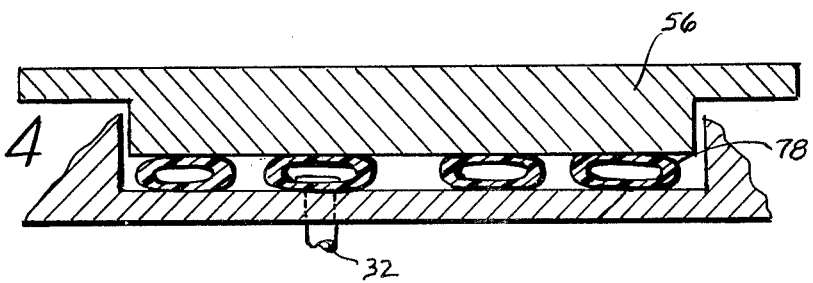

Various inflatable means can be provided for developing the necessary compressive force to urge the platens together and load the spring-biased probe contact units 46 sufficiently to insure good electrical contact with elements of circuit board 44. FIG. 3 illustrates suitable seal means in the form of strips 72 which extend about the continuous gap 74 between boss 20 of platen member 56 and the side wall 76 of cavity 26, thereby rendering entire cavity 26 into an inflatable means. Another alternative inflatable means comprises the continuous hose 78 which is coiled in cavity 26 and is in communication with pressured fluid supply conduit 32, as shown in FIG. 4.

Figure 5:
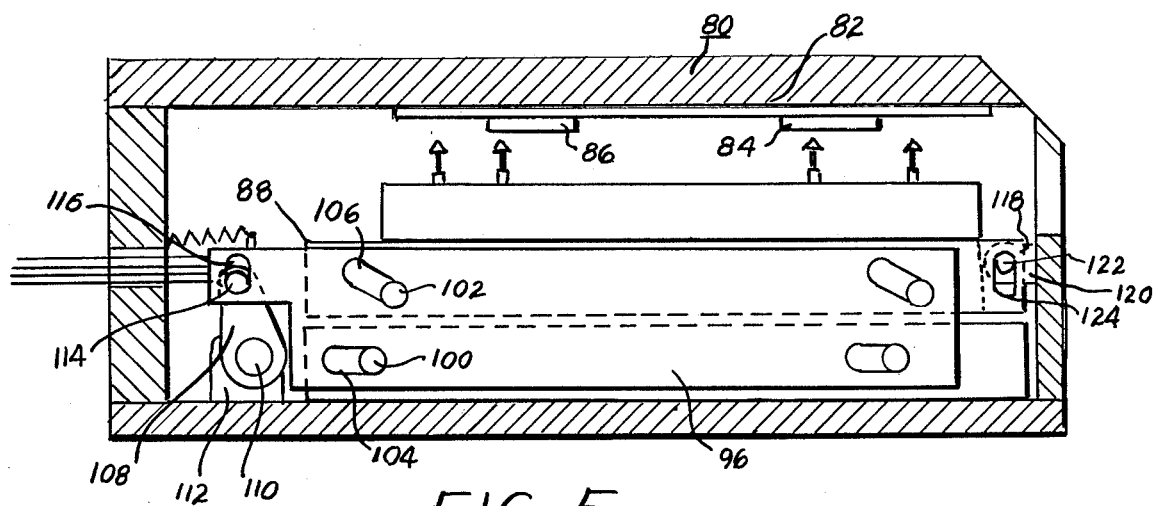
FIGS. 5 and 6 are sectional side and front elevational views of a test fixture of the invention.
Figure 6:
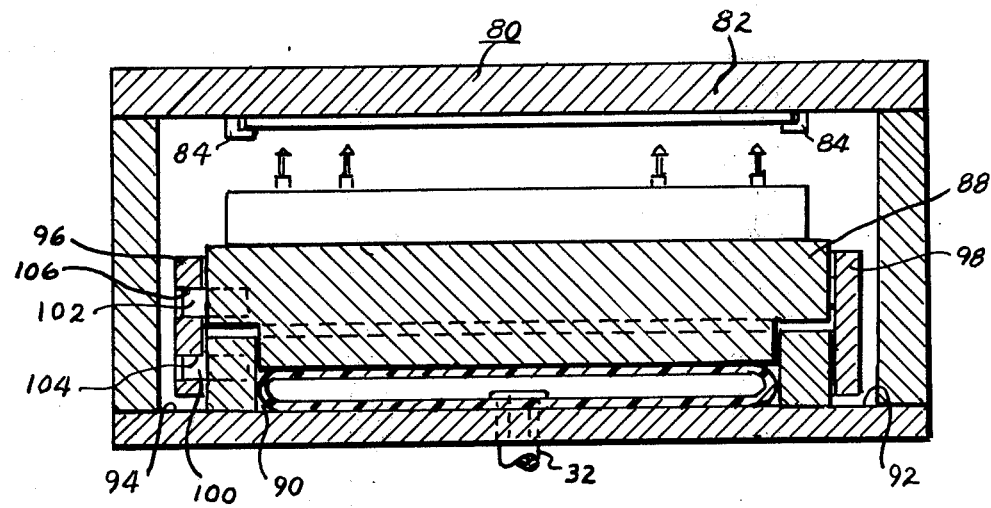

A preferred embodiment of the press means associated with the moveable platen member or members comprises a slidably mounted guide rail means. FIGS. 5 and 6 illustrate such means within housing 80 of a test fixture having an upper, fixed platen member 82 which supports circuit board 44 on shelfs 84 and 86 and lower, moveable platen member 88.

The inside base of housing 10 bears a central recess 90 and longitudinal grooves 92 and 94 to either side thereof. Guide rails 96 and 98 are slidably mounted in grooves 92 and 94 by pin and slot means comprising pins 100 fixedly secured, fore and aft, in the base of housing 10, pins 102 fixedly secured, fore and aft in lower platen member 88, and lower, horizontal slots 104 and upper, inclined slots 106 in each of guide rails. Pins 102 track in slots 106 while pins 100 track in slots 104 whereby reciprocation of the slidable guide rails is mechanically interconnected to raising and lowering of lower platen member 88.

Guide rails 96 and 98 are, preferably, mechanically interconnected by crank and shaft means comprising bell cranks such as 108 mounted to each side of housing 80 which are carried on shaft 110 that is pivotally carried by pillow block means 112 and that extends across housing 80. The upper ends of cranks 108 are coupled to the guide rails by pins 114 which extend from the cranks into sliding engagement with slots 116 in the guide rails.

Means are also provided to restrain the moveable lower platen member 88 against longitudinal movement. Such means can comprise groove 118 in the fore end of member 88 which provides clearance for prong 120. Pin 122 is mounted in member 88, transversing groove 118 and passing through vertical slot 124 in member 118.

Referring now to FIG. 7, there is illustrated an embodiment of the invention for use with removeable and interchangeable probe heads. The test fixture is shown with housing 11 supporting a removeable probe head 13 and a printed circuit board 44 in the open platen position. The housing is of a general box-like configuration with a base or bottom 17, end wall 19, front wall 21 and top wall 23. The housing supports opposite platen members and, to this end, top wall 23 can be of massive construction, as illustrated, to provide one of the platen members. The opposite platen member 25 is supported in the housing on press means which includes a base member 27 having a central cavity 29 surrounded by peripheral edges or side walls 31. The platen member 25 is provided with a central boss 33 which is in juxtaposition to the cavity 29 to permit mounting of press actuator means such as inflatable, flexible bag 35 therein. Base member 27 is fixedly secured to bottom 17 of housing 11 by suitable fastening means such as machine screws 37. A through passageway 39 is provided in base 27 and and the bottom wall 17 of housing 11 and conduit 41 is passed therethrough into communication with the interior of inflatable flexible bag 35 whereby a source of pressured fluid such as pressured air can be introduced into flexible bag 35.

Platen member 25 can be provided with one or more peripheral guide means such as spring guide pins 43 that are seated in a bore of platen member 25 by a press fit, threaded engagement, etc. The pins 43 project downwardly through apertures 45 in peripheral flange 47 extending from side wall 31 of base 27. The lower ends of pins 43 are threaded and bear a stop nut 49 which secures compression spring 51 about pin 42 and serves to bias platen member 25 into its withdrawn or open position. These guide pins are optional features and, accordingly, have been deleted from the view of the fixture presented in FIG. 8.

The moveable platen member 25 is provided with suitable guide means to maintain this platen member substantially parallel to the upper platen member, i.e., the housing top wall during its movement in the assembly. The guide means comprises a guide rail 53 disposed to each side of platen member 25 as shown in FIGS. 7 and 8. As illustrated in FIG. 8, the slidable guide rail 53 is mounted between parallel sets of upper side rails 55 and lower side rails 57. Base 27 is of lesser width than the associated platen member 25 to provide a longitudinal cavity in the housing between platen member 25 and bottom wall 17 whereby the guide means assembly can be mounted within the housing. The lower side rails 57 are affixed to bottom wall 17 by suitable fastening means, e.g., machine bolts 59, which extend into tapped bores in the bottom edge of the side rails. The upper side rails 55 are similarly secured to the upper platen member 25 by machine bolts 60. The two sets of parallel side rails are spaced apart a sufficient distance to accomodate guide rail 53.

As shown in FIG. 7, guide rail 53 bears a plurality of longitudinal apertures. These include a set of longitudinal apertures 63 which are disposed substantially parallel to the bottom ball 17 and a set of apertures 65 which are inclined at a suitable angle, e.g., from 10° to about 45°, to the bottom 17. Pins 67 are inserted in opposed bores in side rails 57 and pass through the elongated apertures 63, which are parallel to bottom 17, while pins 69 are inserted into opposed bores in upper side rails 55, passing through inclined elongated apertures 65 whereby slide rail 53 is mechanically interconnected between bottom 17 of the housing and moveable platen member 25.

Referring now to FIGS. 7 and 10, it can be seen that slide rails 53 are interconnected by suitable crank and shaft means. The inboard ends of slide rails 53 bear slots 71. Crank means 73 are mounted on each side of each slide rail and a pin 75 is inserted in opposed apertures of the ends of cranks 73, passing through slot 71. The opposite ends of cranks 73 bear apertures for mounting of the cranks on a cross shaft 77 which extends across the housing, thereby interconnecting the cranks 73 which are disposed at each side of the housing. Shaft 77 is carried in suitable bearing blocks such as 79.

From the preceding description, it can be seen that guide rails 53 are free to move in a sliding, reciprocal action in housing 11 and that the movement of slide rails 53 is associated with the raising and lowering of platen member 25 as pins 69 are guided in inclined elongated apertures 65. Movement of guide rails 53 to either side of the housing is synchronized by the interconnecting shaft 77 and crank means 73.

The upper side rails 55 are restrained against longitudinal movement by means similar to that described in regard to FIG. 5. This comprises groove 118 in the fore end of each rail 55 in which is placed roller 60 that is supported from prong 120 which projects inwardly from the inside surface of wall 21.

Associated with each reciprocal guide rail 53 is a suitable actuator which can be a fluid actuated cylinder and piston assembly 81 having the supply port fitted with conduit 83 for supply of pressured fluid thereto and having its piston connected to a push rod 85 that bears against the end of slide rail 53. These cylinder assemblies 81 thereby function as pneumatically actuated solenoids to assist the raising and lowering of platen member 25.

If desired, suitable return means can be provided for insuring the lowering of platen member 25. Such return means can be the compression springs 51 and associated pins 43, previously discussed or, if desired, can be resilient means such as tension spring 87 that is biased between an eyelet carried on the inboard end of rails 53 and an opposed eyelet on the interior of end wall 19.

Means are also provided in the testing apparatus to obtain a controlled limited travel of platen member 25. This is accomplished by set screw means 89 disposed on each side of housing 11 and mounted in tapped bores of front wall 21 of the housing. Set screw means 89 project into the housing to a controlled degree and are in longitudinal alignment with guide rails 53 whereby the degree of travel of guide rails 53 can be fixedly adjusted.

The side walls 7 and 9 of the housing, which are shown in FIG. 8, bear longitudinal grooves or guide slots 91 which serve to receive side bars 93 of probe head 13. The probe head 13 is of box-like construction, as described in greater detail hereinafter, and has suitable handle means 95 on its front face. The grooves 91 are of wider dimension than the side rails 93 to accommodate the raising and lowering of probe head 13 in housing 11 by the action of moveable platen member 25. The housing 11 bears an interior cross wall 97 to divide the chamber within the housing into a front and rear compartment. The forward face of interior wall 97 bears suitable switch means such as microswitch 99 which is mounted to be engaged by the inboard end of probe head 13 when the latter is seated properly within the housing.

The top wall 23 of housing 11 also is provided with suitable interface connector means. This is shown as cable 101 containing a plurality of electrical conductors and a connector box or header 103 which has a downwardly directed open face in which are mounted a plurality of members 105 of interface contacts.

The upper surface of probe head 13 bears, in a contact-bearing surface area thereof, which is opposed to the open surface of interface connector 103, a plurality of interface contact members 107 which are oriented so as to mate with their corresponding members 105 when probe head 13 is properly seated on platen member 25 and the latter is raised into the testing position.

The interface contacts and members thereof are shown in greater detail in FIG. 9 where it can be seen that each member 105 comprises a prong having a head 109 on a shaft 111 which is seated within a sleeve 113. Sleeve 113 also bears a compression spring, not shown, which biases shafts 111 into their outboard or extended position, as shown. The mating socket member 107 of the interface contacts comprises a head 131 bearing a tapered recess 115 for seating of the pointed heads 109 of members 105.

The upper surface of probe head 13 also bears, in a limited, second surface area thereof, a plurality of spaced apart probe contact units 117. These probe contact units are oriented about the probe surface area of probe head 13 in a predetermined manner so as to be opposed to preselected points on circuit board 44 when the latter is placed on the upper tips of probe contact units 117 and is aligned to probe head 13 by suitable means. Suitable alignment means can comprise dowels or pins 119 which are carried by probe head 13 and are operative to engage alignment bores of the printed circuit board, typically the mounting holes commonly provided in such printed circuit boards.

The construction of the probe head 13 can be seen by the illustration of FIG. 11. As shown in FIG. 11, the probe head comprises a plurality of parallel and spaced apart plates 121 and 123 with a plurality of spacers such as corner blocks 125 and sleeves 127 disposed therebetween. Sleeves 127 are located about the opposed surfaces of plates 121 and 123 at locations which are free of any interface connector socket members 107 or probe contact units 117. A sufficient number of sleeves 127 are provided about the surfaces of plates 121 and 123 to provide an even transfer of compressive forces applied to these plates without distortion of deflection of the plates from their substantially parallel alignment. The front edges of plates 121 and 123 can be covered with front plate 129 which bears handle 95. The side egdes of these plates support sides 130 which, as previously mentioned, bear side bars 93 for orienting the probe head within housing 11.

The probe head bears two, substantially parallel, contact bearing areas. These areas are generally indicated as the interfacial contact bearing area 132 and the probe contact bearing area 134. As shown in FIG. 11, the illustrated probe head has these areas substantially coplanar.

The probe contact units 117, which are disposed in the predetermined pattern about contact area 134, are conventional in construction and comprise a pointed probe head on the outboard end of a thin rod plunger which is carried by a hollow cylinder that carries a compression spring for urging the plunger into the outboard position. These elements are described and illustrated in greater detail with regard to FIG. 12. The inboard ends of the hollow cylinders bear a connector as a solid form rod or tail 136 which extends from the cylinders into the occluded space between parallel plates 121 and 123. In the preferred embodiment, rods 136 are substantially square in cross section with sharp edges as in the conventional wire wrapped connectors. The inboard ends of interface connectors such as contact socket members 107 are similarly formed with square shanked rods 138 whereby wire connectors such as 139 can be wire wrapped about the square shanked rods 138 and 136 to interconnect one of probe contact units 117 with a preselected one of interface contact socket members 106.

Figure 13:
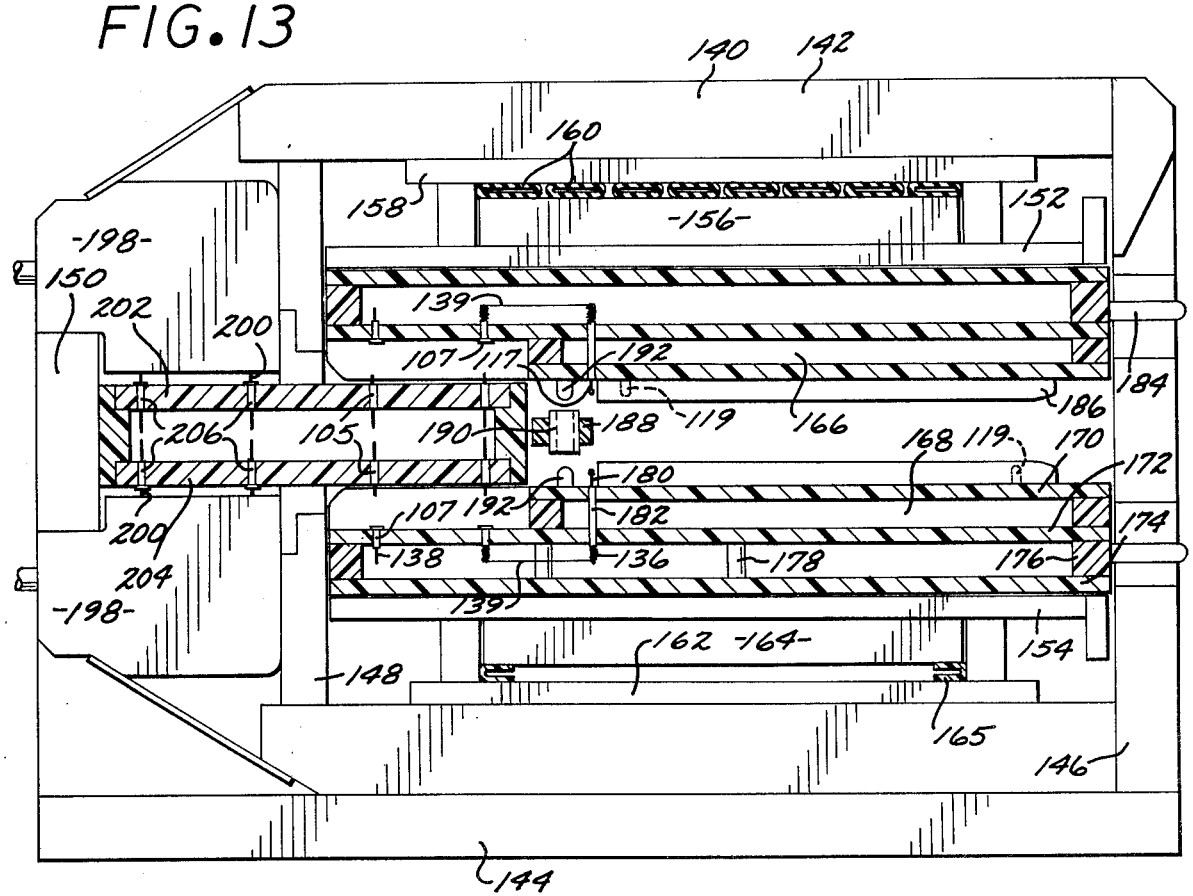

Referring now to FIG. 13, there is illustrated a test fixture and probe head assembly which is particularly adapted for testing a printed circuit board by making simultaneous contact to opposite sides thereof. As shown, the testing fixture comprises a housing 140 that bears upper or top wall 142 and bottom wall 144 maintained in spaced apart, parallel relationship by front wall 146 and internal wall 148. The housing has a rear wall 150.

Mounted within housing 140 are upper platen member 152 and lower platen member 154, which, as illustrated, are each associated with suitable press means and are movable in the assembly. The press means which can be employed comprise a raised boss such as 156 shown on platen member 152 that is fitted, in juxtaposition, to a central cavity of the base 158. Disposed within the cavity of base 158 and adapted to exert a pressure force on boss 156 is flexible bose 160 which is placed in a coil about the area of boss 156. The hose is connected by suitable means, not shown to a source of fluid pressure, typically air pressure, that is effective to expand the hose and thereby raise boss 156 in the internal cavity of base 158. Platen member 154 is similarly provided with press means formed by a corresponding base 162 having a central cavity in which is seated the boss 164 that is on the undersurface of platen member 154. In a typical embodiment, the central cavity within base 162 would have the same pressure transmitting means as flexible hose 160 shown in the chamber of platen base 158. For illustration purposes, however, an alternative fluid pressure actuator is shown. This alternative means is a flexible peripheral seal means 165 which is in the form of a flexible, generally U-shaped membrane that extends about the periphery of the chamber. Alternatively, seal means could be carried directly on piston 164 in the form of O-rings, piston rings and the like.

Although not shown, the platen members 152 and 154 are provided with guide rail means such as the guide rail means previously described with regard to FIGS. 7, 8 and 10 for maintaining these platen members in substantially parallel alignment during the raising the lowering of the platens. Such guide rail means would include guide rails, slidably mounted at opposite sides of both platen members 152 and 154 and all of the guide rails would be interconnected by crank and shaft means similar to that shown in FIG. 10 to maintain these guide rails in synchronism.

Each of the platen members 152 and 154 carried a surmounted probe head 166 and 168. The particular probe heads illustrated comprise an assembly of three substantially parallel plates 170, 172 and 174 which are maintained in spaced-apart parallel alignment by corner blocks such as 176 and sleeve spacers 178 which are disposed about the surfaces of the plates so as to maintain the plates in parallel alignment during the application of compression loading thereon. The use of three parallel plates is desirable to accommodate probe contact units of greater deflection and length than previously described which are used to make contacts onto circuit boards having contact points at substantially varied heights. Plates 170 and 172 are bored at predetermined locations about the probe contact unit 117. As previously described, each probe contact unit 117 comprises a pointed head carried at the outboard end of a thin rod plunger 180 that is mounted in a sleeve 182 which also contains a spring operative to bias the rod plunger 180 into the outboard position. The sleeve also has a dependent, square or rectangular shanked tail 136 extending therefrom into the occluded space between plates 172 and 174. These probe contact units are located at predetermined points about the probe contact area of the probe heads 166 and 168 so as to engage preselected points on a circuit board when the latter is aligned in the test fixture.

Disposed about the interface contact area of probe heads 166 and 168 are a plurality of regularly aligned interface-contact members 107. These socket members, as previously described, have inboard ends 138 which extend from the base of the sleeves of the socket members into the occluded space between plates 172 and 174. Preselected ones of socket members 107 are interconnected by wire connectors 139 to a preselected one of probe contact units 117, preferably by utilizing conventional wire wrapping techniques.

The probe heads also include suitable handle means such as handle 184 on the front surface thereof and protective rails such as 186 that are mounted about the probe contact area to prevent damage to the delicate, protruding probe contact units 117 during the handling and storage of the probe heads. There is provided, within the space between the moving platen members 152 and 154 suitable guide means for insuring the proper registration of the probe heads during closing of the platen members of the text fixture. Such registration means can be in the form of cross braces 188 which extend between the side walls of the test fixture along the registration plane of the platen members which, in a symmetrical unit such as that shown in FIGS. 13 and 14 would be along its midline. The cross braces 188 bear suitable alignment sleeves 190 which are cooperative with dowel pins 192 carried on each of probe heads 166 and 168 whereby these probe heads are maintained in alignment during the closing of the platen members.

Figure 14:
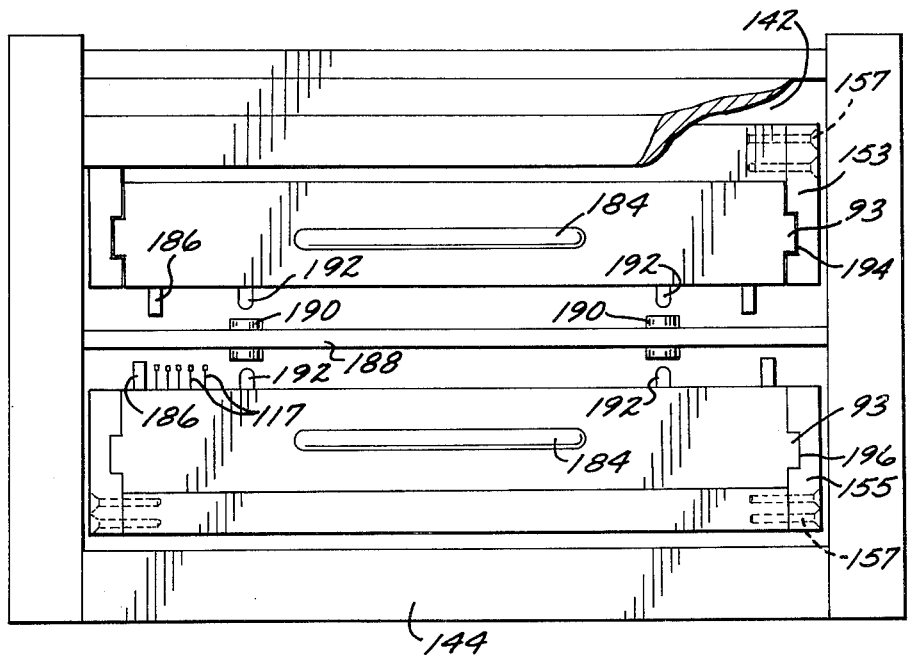
FIG. 14 is a front view of the test fixture and probe heads of FIG. 13.

As shown in FIG. 14, each of the platen members 152 and 154 carry at each side, support rails 153 and 155. These rails are secured to the platens by suitable means such as screws 157 and project past the bearing surfaces of the platens. Each rail has an inboard slot 194 and 196 which receive side bars 93 carried on the side of probe heads 166 and 168. These rails with their inboard slots and cooperative side bars 93 form means to support the probe heads on the platen members.

The device, as shown in FIGS. 13 and 14, is adapted to accommodate conventionally sized interface connector boxes 198. These connector boxes are carried by rear wall 150 and intermediate wall 148 and are positioned with their open faces in opposed, space-apart alignment about the midplane of the test fixture. Each interface connector box bears a plurality of interface connector contact members 200 which are preferably of the probe construction and are aligned so as to be engaged in interface-contact socket members 206 to provide interface contact assemblies. The socket members 206 are carried by an assembly of first printed circuit board 202 and second printed circuit board 204 bearing printed circuit conductor means extending from a preselected one of socket member 206 to a preselected one of interface probe contacts 105. Interface probe contacts 105 are positioned at predetermined points in the circuit boards 202 and 204 so as to be opposed to a mating interface contact socket member 107. The latter socket members 107 are carried on plate 172 of each of probe heads 166 and 168 and are parallel but subjacent to the probe contact units 117 carried on plate 170 by a distance which approximates the movement of platen members 152 and 154 of the test fixture. In this manner, closing of the platen members into the testing or registration position will move socket members 107 carried by plates 172 into engagement with the probes of interface contact members 105.

The operation of the test fixture illustrated in FIG. 12 is readily apparent from the preceding description. In this testing, a printed circuit board is placed between probe heads 166 and 168 and aligned thereto by suitable means such as alignment dowels 119 carried on plates 170 of the probe heads. Typically, the printed circuit board would be placed with its undersurface resting on the protruding plungers 180 of the probe contact units 117 carried on the lowermost probe head 168. The platen members would then be urged into a closed position by the supply of air pressure to the fluid actuators such as hose 160 or the sealed chamber beneath boss 164 and sufficient pressure would be applied to firmly seat the probe contact units 117 against their contact points on the printed circuit board. Thereafter, the circuitry of the printed circuit board can be tested in the conventional manner.

The invention has been described by reference to the illustrated and presently preferred embodiments thereof. It is not intended that the invention be unduly limited by this disclosure of presently preferred embodiments. Instead, it is intended that the invention be defined by the means and obvious equivalents thereof set forth in the following claims.

I claim:
1. A circuit board test fixture which comprises:
 a housing;
 a pair of generally opposed and parallel platen members carried therein with at least one of said platen members movably mounted in said housing with peripheral flange means and an integral central boss carried by said member, said central boss received within a coextensive, central cavity formed by the facing interior wall of said housing and spaced apart from the bottom of said central cavity to define a central chamber therein;
 guide rail means on opposite sides of the movable platen member and connected by guide pins at opposite ends thereof between said movable platen member and housing to maintain said platen members in parallel alignment during movement of said movable platen member;

means for supporting a circuit board against one of said platen members;

means for supporting on the other of said platen members pressured contact units juxtaposed towards said circuit board;

fluid-sealed expansion means within said chamber; and means communicting with said fluid-sealed means exteriorly of said chamber for sending pressured fluid into said sealed expansion means to impart relative movement to said platen members and direct said contact units against circuitry of said circuit board.

2. The test fixture of claim 1 wherein said pressured contact units comprise spring-loaded plungers.

3. The test fixture of claim 1 wherein said sealed means is an expandable tube.

4. The test fixture of claim 3 wherein said expandable tube comprises an endless tube coiled in said cavity.

5. The test fixture of claim 1 wherein said sealed means is an expandable bag.

6. The test fixture of claim 1 wherein said sealed means comprises flexible seal strips extending continuously about the periphery of said cavity.

7. The test fixture of claim 1 wherein one of said platen member includes a removable test probe head in the form of a generally flat plate bearing a plurality of said pressured contact units at preselected points thereon.

8. The test fixture of claim 7 wherein the upper one of said platen members bears said test probe head.

9. The test fixture of claim 7 wherein the lower one of said platen members bears said removable probe head.

10. A circuit board test fixture which comprises:
a housing;
a pair of generally opposed and parallel platen members carried therein by means whereby at least one of said members is a moveable platen member, relative to the other of said members;
press means associated with said moveable platen member and operative to move said platen members relative to each other into and out of registration;
said press means including a guide assembly of:
sliding guide rail means for reciprocable slidable movement in said housing and bearing a plurality of slots at opposite ends thereof including a set of elongated slots parallel to the direction of slidable mounting of said rail and a set of elongated slots at an inclined angle thereto;
first side rail means affixed to said moveable platen member and bearing pins which are engaged in said inclined slots; and
second side rail means affixed to said housing and bearing pins which are engaged in said elongated slots whereby said slidable movement of said guide rail will guide the movement of said moveable platen member and maintain said platen members in substantially parallel orientation throughout such movement.

11. The test fixture of claim 10 wherein a pair of said guide rail means is provided, one each located at each side of said press means.

12. The test fixture of claim 10 including resilient means biased between said housing and said moveable platen member to urge said platen members out of registration.

13. The test fixture of claim 10 wherein said moveable platen member has peripheral flange means and a central flat boss supported by said flange means over a juxtaposed cavity between said boss and the facing interior wall of said housing with inflatable means mounted in cavity and means to supply a pressured fluid thereto to effect movement of said platen member.

14. The test fixture of claim 13 including a pneumatic piston and cylinder assembly mounted between said housing and said guide rail means which is operable to urge said platen members into registration.

15. The test fixture of claim 13 including a pneumatic piston and cylinder assembly mounted between said housing and said guide rail means which is operable to urge said platen members out of registration.

16. The test fixture of claim 13 wherein said housing bears switch means with lever means projecting into the housing whereby external circuit means can be controlled by the position of the probe head.

17. The test fixture of claim 16 wherein said external circuit means includes solenoid valve means in the pressured fluid supply means to said inflatable means.

18. The test fixture of claim 10 wherein said housing bears screw means threadably mounted in its front wall and projecting therein into interference with said guide rail means at the extremity of its slidable movement whereby the travel of said guide rail can be fixedly adjusted.

19. The test fixture of claim 10 wherein said moveable platen member bears alignment pins and its base member bears cooperative and opposed socket means therefor whereby the said platen member can be guided into precise registration.

20. The test fixture of claim 10 wherein said housing bears an assembly of interface contact members in an area spaced apart from and substantially parallel to said platen members with conductor lead means extending externally of said housing from the said interface contact members.

21. The test fixture of claim 10 wherein each of said platen members bears press means operative to urge its platen member towards the midline of said fixture.

22. The test fixture of claim 21 wherein said housing bears two opposed assemblies of interface contacts in parallel planes with rigid connector means carried therebetween and projecting into the space between said platen members, each of said rigid connector means bearing a plurality of interface connector contact members carried thereon and projecting to either side thereof.

23. The test fixture of claim 21 wherein each of said probe heads bears alignment pin means and said housing supports cooperative socket means whereby said platen members can be guided into precise alignment.

24. The circuit board test fixture of claim 1 including a plurality of guide pins carried on the periphery of said movable platen member and slidably received in bores of said housing sidewalls.

25. The circuit board test fixture of claim 24 including spring means with each of said guide pins to bias said guide pins into their respective receiving bores, thereby urging said movable platen member into its retracted position.

* * * * *